United States Patent [19]

Murphy

[11] Patent Number: 5,242,051
[45] Date of Patent: Sep. 7, 1993

[54] CARRIER MAGAZINE END STOP

[75] Inventor: Robert H. Murphy, Merrimack, N.H.

[73] Assignee: R. H. Murphy Company, Inc., Amherst, N.H.

[21] Appl. No.: 706,870

[22] Filed: May 29, 1991

[51] Int. Cl.⁵ .............. A47B 21/00; B65D 73/02; B65D 85/42
[52] U.S. Cl. .................. 206/328; 206/334; 24/615; 24/616; 24/453
[58] Field of Search .............. 206/334, 328; 24/615, 24/616, 697.1, 297, 453

[56] References Cited

U.S. PATENT DOCUMENTS

| | | | |
|---|---|---|---|
| 2,758,498 | 8/1956 | Johnson | 24/453 |
| 4,485,531 | 12/1984 | Murphy | 206/328 |
| 4,708,895 | 11/1987 | Mizusawa | 24/297 |
| 4,901,204 | 2/1990 | Hyashi | 24/297 |
| 4,903,380 | 2/1990 | Kirby | 24/297 |

FOREIGN PATENT DOCUMENTS 0948609 2/1964 United Kingdom .............. 24/297

Primary Examiner—Paul T. Sewell
Assistant Examiner—Marie D. Patterson
Attorney, Agent, or Firm—Pearson & Pearson

[57] ABSTRACT

An end stop for use in a magazine for carrying components. The end stop comprises a head that overlies one of a set aligned apertures in a magazine. A leg projecting from the head passes through the apertures to obstruct an opening at the end of the magazine. A retaining structure hinged to an intermediate portion of the leg extends toward the head and is spaced from a top wall of the structure. As the end stop is inserted, the wall of the magazine pivots the retaining means. After the retaining means passes through the wall, the retaining means relaxes to overlie the wall and capture the end stop to the magazine.

18 Claims, 3 Drawing Sheets

CARRIER MAGAZINE END STOP

BACKGROUND OF THE INVENTION

Field of the Invention

This invention generally relates to stop devices and more specifically to end stop members useful in tubular magazines used for storing and transporting multiple electronic components for transport.

Description of Related Art

It is well known to house individual electronic components in a tubular magazine for component storage and bulk component transport. Such magazines also can serve to feed individual components during automated and other assembly operations. The following patents disclose a number of such magazines and their respective end stops:

U.S. Pat. No. 4,485,531 (1984) Murphy
U.S. Pat. No. 4,553,190 (1985) Mueller
U.S. Pat. No. 4,592,481 (1986) Chen
U.S. Pat. No. 4,624,364 (1986) Swain
U.S. Pat. No. 4,685,562 (1987) Swain Each of the foregoing patents discloses a magazine, sometimes called a component carrier or tube that stores individual integrated circuits and the like. The individual circuits can slide along a magazine axis. During storage and transport stop devices at each end of the magazine confine individual components in the magazine regardless of the magazine's orientation.

The Murphy and Mueller patents disclose such stop devices that pass through aligned apertures in a magazine to obstruct an end opening. These devices generally comprise a head, a shank projecting from the head and a clamping or retaining structure that compresses while passing through the apertures and then expands. The clamping means and head coact to capture the end stop axially in the magazine. Chen discloses a resilient stopper that inserts into the open end of a magazine to fill the opening. Friction between the stopper and the tube holds the stopper in place. The Swain —364 patent discloses a pin structure augmented with a bow-shaped member that inserts in the tube, the end stop confining the insert from being forced out of the tube. The Swain —562 patent discloses a releasable stop device comprising an integrally formed member with multiple legs that interlace through multiple apertures in the magazine to obstruct the end of the tube.

Each of these references discloses a tube for transporting individual integrated circuit components. These components are lightweight, so any sudden impact of the magazine contents, produced by any number of external forces, on an end stop is limited. Now, however, magazines store and transport integrated circuits in individual carriers to protect individual integrated circuits, to avoid physical or electrical damage to the integrated circuits and to facilitate the manufacturing process.

As known an integrated circuit component carrier provides three basic functions. It protects an individual component from mechanical shock, it dissipates electrostatic charges and it supports the integrated circuit for testing. U.S. Pat. No. 4,765,471 of Robert Murphy for an Electrical Component Carrier and a copending U.S. patent application Ser. No. 07/495,860 filed Mar. 19, 1990 for Carriers for Integrated Circuits and the Like, both of which are assigned to the Assignee of this invention, disclose such carriers. These carriers are significantly heavier than the individual integrated circuits they support, so there is a proportionate increase in the magnitude of the forces that an end stop must absorb when one or more carriers impact.

It has been found that the stop devices of the prior art can shear during such shocks and open the end of the magazine. With some end stops portions extend beyond the tube and are susceptible to breakage during the typical handling, with the result of opening the end of the magazine. These end stops also can be difficult to use. The forces that compress the retaining structure during insertion and authorized removal are of the same magnitude as the forces that must be withstood to keep the end stop in place. Thus, if an end stop is designed to maximize irs clamping power, it becomes difficult to insert and remove the stop. If the design facilitates insertion and removal, the ultimate clamping strength of the end stop is reduced and the end stop is less reliable. The clamping structures of prior art end stops also undergo significant deflection and are subject to fatigue and breakage after repeated use.

SUMMARY

Therefore, it is an object of this invention to provide an improved end stop that is particularly useful with magazines carrying integrated circuit components and component carriers.

Another object of this invention is to provide an end stop with a construction that is less susceptible to breakage from shear or impact forces.

Still another object of this invention is to provide an end stop that is easier to use and readily adapted to automated techniques.

Yet still another object of this invention is to provide an end stop that is resistant to breakage as a result of fatigue.

An end stop constructed in accordance with this invention is adapted to capture components in a magazine by passing through aligned apertures in parallel spaced walls of the magazine. The end stop includes a head that overlies an aperture on one side of the first parallel wall. An axially extending integral leg means projects from this head through the set of aligned apertures to expand and block the end opening. A retaining structure extends from an intermediate position on the leg. A free end, spaced from the head by a distance corresponding to the thickness of the first wall, deflects during axial motion of the legs past the first wall and then deflects outwardly. In a relaxed position, the free end overlies the first wall adjacent the aperture. In this position it interferes with any attempt to displace the end stop axially.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
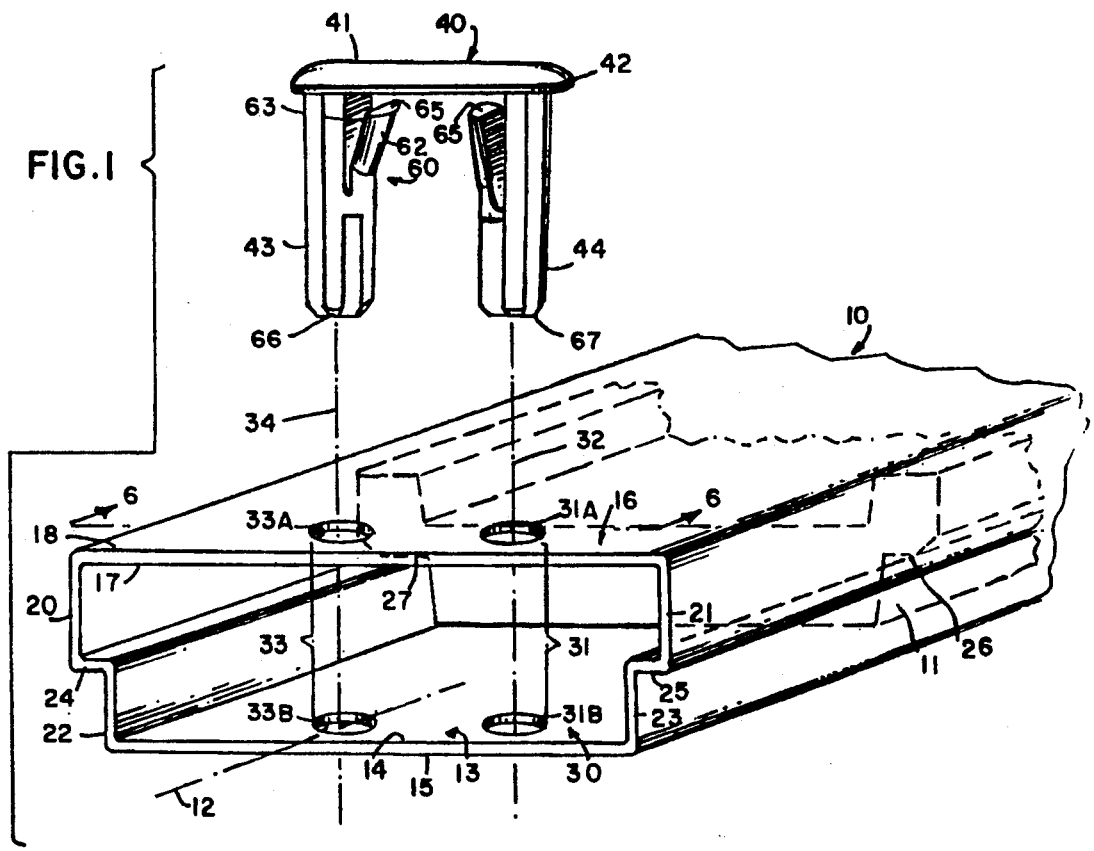
FIG. 1 is a perspective view of a magazine and component carrier with an end stop constructed in accordance with this invention.
Figure 2:
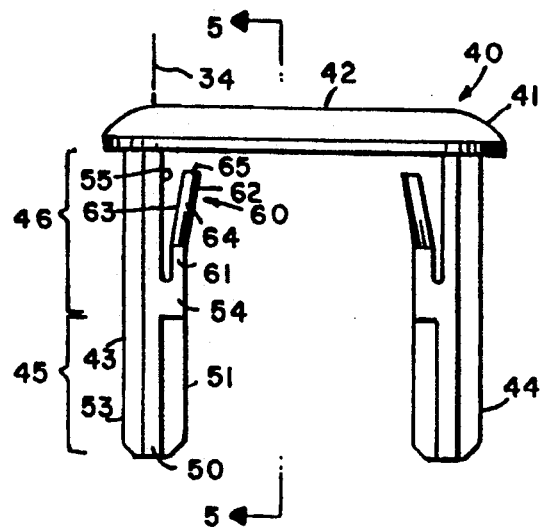
FIG. 2 is a front plan view of the end stop shown in FIG. 1.
Figure 3:
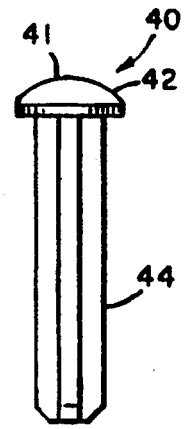
FIG. 3 is a side view of the end stop shown in FIG. 1.
Figure 4:
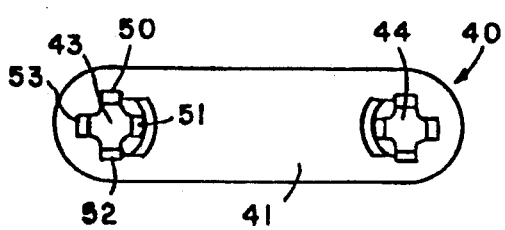
FIG. 4 is a bottom view of the end stop shown in FIG. 1.
Figure 5:
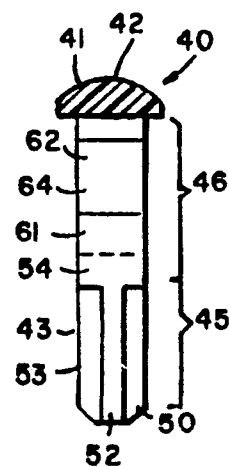
FIG. 5 is a section line of the end stop taken along lines 5—5 in FIG. 2.

FIG. 1 discloses a magazine 10 for carrying a plurality of component carriers, one such component carrier 11 being shown in phantom. The magazine 10 extends along a longitudinal axis 12 and comprises a bottom wall 13 with an inner surface 14 and an outer surface 15. A top wall 16 has an inner surface 17 and an outer surface 18. The bottom and top walls 13 and 16 are thin and, as known, have predetermined thicknesses.

The magazine 10 additionally comprises oppositely facing upper side walls 20 and 21 and lower side walls 22 and 23 offset, respectively, from the upper side walls 20 and 21 by offsetting platforms 24 and 25. The horizontal platforms 24 and 25 provide support surfaces for surfaces 26 and 27 on the magazine 10. These offsetting platforms 24 and 25 therefore provide a means for allowing the longitudinal displacement of the carriers along the axis 12. Thus, it will be apparent that the magazine 10 is adapted to store and transport a plurality of component carriers such as the component carrier 11.

The magazine 10 has an open end 30 for loading and unloading the individual component carriers. Normally the magazine will be open at both ends. A first set of apertures 31, comprising an aperture 31A in the top wall 16 and an aperture 31B in the bottom wall 13 lie along an axis 32. The axis 32 is transverse to the bottom and top walls 13 and 16. Normally the aperture 31A will be larger than the aperture 31B. A second set of aligned apertures 33 similarly lie along an axis 34 that parallels the axis 32 and extends through the top and bottom walls 16 and 13. An upper aperture 33A in the top wall 16 normally has a larger diameter than an aperture 33B in the bottom wall 13.

The first and second sets of aligned apertures 31 and 33 receive an end stop 40 constructed in accordance with this invention. As shown in FIGS. 1 through 5, the end stop 40 has head 41 with a curved upper surface 42. The head has a length and width that enables it to rest on the upper surface 18 and to overlie both the apertures 31A and 33A.

The end stop 40 additionally contains spaced legs 43 and 44 that project from the head 41 and are spaced to align with axes 32 and 34. As each of legs 43 and 44 has the same general construction, only the leg section 43 is described in detail. As shown particularly in FIGS. 2 through 5, the leg 43 has a first or lower section 45 displaced from the head 41 by a second or upper section 46. The head 41 and legs 43 and 44 constitute an integrally molded structure.

The lower portion 45 of the leg 43 has a cruciform cross-section with four fins or arms 50, 51, 52, and 53 that radiate at right angles to each other. The arms 50, 52 and 53 lie continuously along the entire length of the leg 43 including both the lower section 45 and the upper section 46. The arm 51 terminates an integrally molded arcuate band 54 at an intermediate position along the leg 43. This band 54 constitutes a boundary between the lower and upper sections 45 and 46 The upper section 46 is characterized by a planar surface 55 that is displaced slightly from the axis 34 toward the axis 32. The surface 55 is on the same side of the leg as the arm 51, but is longitudinally displaced to the other side of the band 54.

The band 54 supports an integrally molded retaining means 60 60 that extends toward the head 41. There is a space between the retaining means 60 and the planar surface 55. The retaining means 60 includes a linear shank 61 that is integrally molded to the band 54 and that parallels the surface 55. The linear shank 61 can pivot about the intermediate band 54 due to the natural resiliency of the molding materials and the dimensions of the materials at the intersection of the band 54 and the shank 61. The linear shank 61 supports a linearly extending capture arm 62 with a flat surface 63 that faces the planar surface 55 and a curved surface 64 that faces the leg 44. In a relaxed position, the linear capture arm 62 lies along an axis that is skewed with respect to an intersecting axis through the linear shank 61 Thus the linear capture arm 62 slopes toward the opposite leg 44 as it extends toward the head 42. The linear capture arm 62 terminates in a free end 65 that is spaced from the head 41 by a distance that is greater than the thickness of the top wall 16 shown in FIG. 1.

Figure 6:
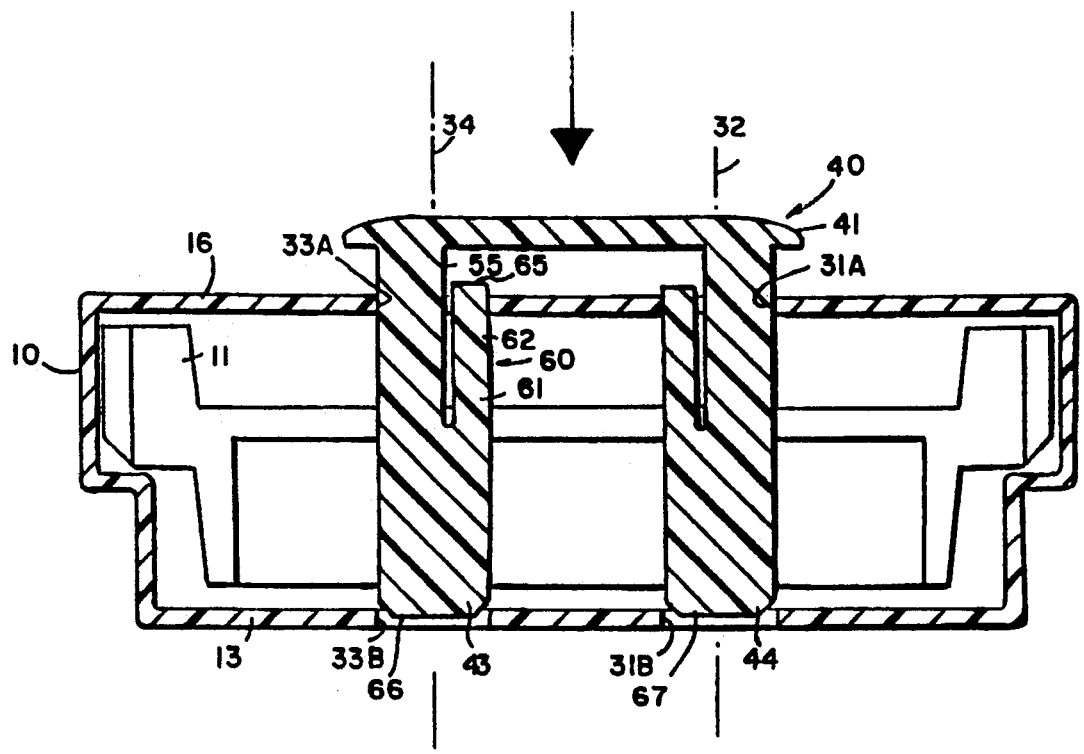
FIG. 6 is a cross-sectional view taken generally along line 6—6 is FIG. 1 of a magazine partially inserted.

Referring now to FIGS. 1 and 6, during the insertion, an individual or machine positions the end stop 40, shown in FIG. 1, with the legs 43 and 44 lying on the axes 34 and 32 respectively As the end stop 40 moves along the axes 32 and 34, beveled end sections 66 and 67 on each of the legs 43 and 44, respectively, pass through the apertures 33A and 31A. With further displacement, the beveled end sections 66 and 67 advance toward the apertures 31B and 33B in the bottom wall 13. When the top Wall 16 engages the curved surface 64 of the linear shank 61 adjacent the band 54, further vertical displacement causes the top wall 16 to cam or pivot the linear capture arm 61 about the band 54 toward the planar surface 55. As the beveled ends 66 and 67 reach and align with the apertures 33B and 31B as shown in FIG. 6, the wall 16 acts against the curved surface 64 and further displaces the capture arm 62 toward the planar surface 55. Only a minimal force is required to bend this retaining means 60, so the force necessary to insert the end stop remains low.

Figure 7:
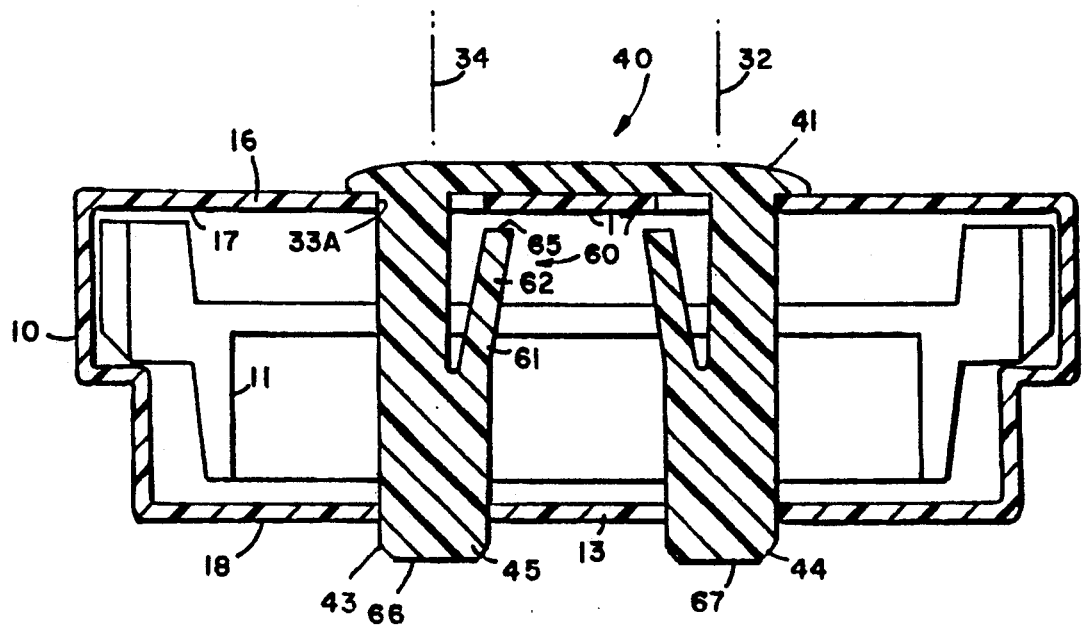
FIG. 7 is a cross-sectional view taken along line 6—6 in FIG. 1 wherein an end stop is fully inserted in a magazine.

When the end stop 40 seats with the head 41 lying on the top wall 16, as shown in FIG. 7, the free end 65 clears the outer surface 18 of the wall 16. The resilient forces introduced into the retaining means 60 during the camming operation now displace the linear capture arm 62 back to its original position. In this position, as shown in FIG. 7, the free end 65 overlies a portion of the inner surface 17. Any attempt to displace the end stop 40 along the axes 32 and 34 is prevented because the free end 65 will abut the top wall 16. With this construction the forces needed to defeat the capture must be very high because they act on the linear capture arm 60 essentially in compression. They would have to break the retaining means 60 off the leg 43 to overcome the blocking force.

This end stop construction facilitates a removal by manual or automated means. In the manual mode, an individual merely needs to insert a finger between the legs 43 and 44 and move one of the retaining means against a leg such as the capture arm 62 against the leg 43. There is sufficient clearance between the end stop 40 and the magazine 10 to allow the beveled end 66 to be pressed along the axis 34 toward the top wall 16 so that the end stop 41 cants until the top wall 16 engages the end of captures the capture arm 62. A similar action taken with respect to the leg 44 then returns the end stop 41 to a position approximately as shown in FIG. 6. In this position it is an easy matter to manually lift the end stop 40 from the magazine 10. It will also be apparent a wedge structure that could be inserted along the axis 12 in FIG. 1 by manual or automated means to engage the camming surfaces, such as surface 64, on the retaining means and simultaneously pivot them against their respective legs. Again as this is a relatively small force, it introduces rather insignificant friction that would not impede the removal of the end stop by manual or automated means.

An end stop 40 constructed in accordance with this invention optimizes and provides maximum holding power while facilitating insertion and intentional removal. That is, the forces needed to compress the retaining means 60 against the leg 43 is significantly less than the force required to break the retaining means 60 off the leg 43.

The use of parallel legs 43 and 44 in the end stop 41 reduces the potential for shearing caused when component carriers slide along the axis 12 in FIG. 1 and impact the end stop 40. Further, the retaining means are located intermediate the top and bottom walls 13 and 16 of the magazine 10 to protect the end stop 41 from physical damage, particularly to the retaining means.

As also known, the deflection of an arm in a retaining means, such as the arm 62 in the retaining means 60, about a band 54 in an integrally molded structure, such as the end stop 40, can be accomplished repeatedly without material failure caused by fatigue. Thus, this end stop overcomes fatigue problems encountered in a number of prior art structures.

FIGS. 1 through 7 therefore depict a particular embodiment of an end stop 40 that has high reliability, that is easy to use and is easy to manufacture. The spacing between the legs 43 and 44 may vary with respect to different magazines. An end stop for lightweight structures could comprise a modified head a single leg and retaining means such as shown in FIGS. 1 through 7. An end stop, such as shown in FIGS. 1 through 5, might have a retaining means formed on only one of the legs. Cruciform cross-sections are shown because they provide maximum strength with a minimal material volume. It will be apparent that other cross-sections can also be used. It also will be apparent that these and many other modifications can be made to the disclosed apparatus without departing from the invention while attaining some or all of the objects and advantage of this invention. Therefore, it is the intent of the appended claims to cover all such variations and modifications as come within the true spirit and scope of this invention.

What is claimed as new and desired to be secured by Letters Patent of the United States is:

1. A removable end stop for use with an open-ended elongate component carrier magazine means for transporting an electronic component therein wherein the magazine has first and second spaced parallel walls of predetermined thicknesses, each of the walls having inner and outer surfaces and first and second paced sets of aligned apertures through the walls at one end of the magazine for receiving said end stop thereby to confine a component in the magazine, said removable end stop comprising:
   A. head means for engaging the outer surface of the first wall thereby to overlie each aperture in the first and second sets of apertures through the first wall,
   B. first axially extending integral leg means projecting from said head means for insertion through the first set of apertures thereby to span the end opening and second axially extending integral leg means spaced from and parallel to said first leg means for extending through the aperture of the second set through the first wall, and
   c. elongated retaining means pivotally attached to an intermediate position on one of aid leg means and having a free end spaced from said head means by a distance corresponding to the thickness of the first wall, said retaining means being located intermediate the first and second walls when said stop means is inserted in the carrier magazine means and normally being skewed with respect to said leg means for coacting with said head means to capture said end stop at the first wall of the magazine, said free end of said retaining means being pivoted toward said leg means to enable ready passage of said retaining means and said leg means through the first wall when said end stop is inserted in or removed from the magazine carrier means.

2. A removable end stop as recited in claim 1 wherein said retaining means includes a linear shank portion integrally formed at one end thereof with said leg means and a linear capture portion extending from the other end and being skewed with respect to, said shank portion thereby to form a camming surface for interacting with the first wall, the first wall pivoting said retaining means toward said leg means as said end stop is inserted into the magazine.

3. A removable end stop as recited in claim 1 wherein said leg means has a first portion that is coextensive with said retaining means and that passes through the aperture in the first wall and a second portion extending beyond said retaining means for passing through the aperture in the second wall thereby to locate said retaining means intermediate the walls when inserted in the magazine.

4. A removable end stop as recited in claim 3 wherein said second leg portion has a cruciform cross-section and said first portion has a quasi cruciform cross-section.

5. A removable end stop as recited in claim 3 wherein said retaining means includes a linear shank portion integrally formed with and spaced from said first leg portion and a linear capture portion extending from the other end of and being skewed with respect to said shank portion thereby to form a camming surface for interacting with the first wall, the first wall pivoting said retaining means toward said first leg portion as said end stop is inserted into the magazine.

6. A removable end stop as recited in claim 5 wherein said second leg portion has a cruciform cross-section and said first leg portion has a quasi cruciform cross-section with a planar surface spaced and facing said retaining means.

7. A removable end stop for use with an open-ended elongate component carrier magazine means for transporting an electronic component therein wherein the magazine has first and second spaced parallel walls of predetermined thicknesses, each of the walls having inner and outer surfaces and first and second spaced sets of aligned apertures through the walls at one end of the magazine for receiving said end stop thereby to confine a component in the magazine, said removable end stop comprising:

A. head means for engaging the outer surface of the first wall thereby to overlie each aperture in the first and second sets of apertures through the first wall, B. first and second spaced parallel, axially extending integral leg means projecting from said head means for insertion through the first and second sets apertures respectively thereby to span the end opening, and c. first and second retaining means for capturing the first wall against said head means, each of said first and second retaining means including an arm pivotally attached at one end to an intermediate position on a respective one of aid first and second leg means and having a free end spaced from said head means by a distance corresponding to the thickness of the first wall, each said arm normally being skewed with respect to a corresponding leg means so the free end thereof is spaced from said corresponding leg means to overlie the first wall when said end stop is inserted in the magazine and being pivoted toward said corresponding leg means to enable ready passage of said retaining means and said leg means through the first wall when said end stop is inserted in or removed from the magazine carrier means.

8. A removable end stop as recited in claim 7 wherein each said retaining means includes a linear shank portion integrally formed at one end thereof with said corresponding leg means and a linear capture portion extending from the other end of and being skewed with respect to said shank portion thereby to form a camming surface for interacting with the first wall, the first wall pivoting each of said retaining means toward said respective leg means as said end stop is inserted into the magazine.

9. A removable end stop as recited in claim 7 wherein each said leg means has a first portion that is coextensive with said retaining means and that passes through the aperture in the first wall and a second portion extending beyond said retaining means for passing through the aperture in the second wall thereby to locate said retaining means intermediate the walls when inserted in the magazine, said retaining means being formed on facing portions of said first and second leg means.

10. A removable end stop as recited in claim 9 wherein each said second leg portion has a cruciform cross-section and each said first portion has a quasi cruciform cross-section.

11. A removable end stop as recited in claim 9 wherein each said retaining means includes a linear shank portion integrally formed at one end thereof and spaced from said corresponding first leg portion and a linear capture portion extending from the other end of and being skewed with respect to said shank portion thereby to form a camming surface for interacting with the first wall, the first wall pivoting each of aid retaining means towards said first portions of aid respective leg means as said end stop is inserted into the magazine.

12. A removable end stop as recited in claim 11 wherein said second leg portion has a cruciform cross-section and said first leg portion has a quasi cruciform cross-section with a planar surface spaced and facing said retaining means.

13. A system for transporting electronic component comprising:

A. open-ended elongate component carrier magazine means for containing electronic components therein, said magazine having first and second spaced parallel walls of predetermined thicknesses, each of the walls having inner and outer surfaces and first and second spaced sets of aligned apertures through said walls at one end of the magazine, and B. removable end stop means for insertion through said first and second sets of aligned apertures for confining the components in said magazine, said removable end stop including:

i. head means for engaging the outer surfaces of said first wall thereby to overlie each aperture in said first and second sets of apertures through said first wall, ii. first and second axially extending integral leg means projecting from said head means for insertion through said first and second sets apertures respectively thereby to span the end opening, and iii. first and second retaining means for capturing said first wall against said head means, each of said first and second retaining mean including an arm pivotally attached at one end to an intermediate position on a respective one of aid first and second leg means and having a free end spaced from said head means by a distance corresponding to the thickness of said first wall, each said arm normally being skewed with respect to a corresponding leg means so said free end thereof is spaced from said corresponding leg means to overlie said first all when said end stop is inserted in said magazine and being pivoted toward said corresponding leg means to enable ready passage of aid retaining means and said leg means through aid first wall when said end top is inserted in or removed from said magazine carrier means.

14. An electronic component transporting system as recited in claim 13 wherein each said retaining means includes a linear shank portion integrally formed at one end thereof with said corresponding leg means and a linear capture portion extending from the other end of and being skewed with respect to said shank portion thereby to form a camming surface for interacting with said first wall, said first wall pivoting each of said retaining means towards said respective leg means as said end stop is inserted into the magazine.

15. An electronic component transporting system as recited in claim 13 wherein each said leg means has a first portion that is coextensive with said retaining means and that passes through the aperture in said first wall and a second portion extending beyond said retaining means for passing through said aperture in the second wall thereby to locate said retaining means is located intermediate said walls when inserted in said magazine, said retaining means being formed on facing portions of said first and second leg means.

16. An electronic component transporting system as recited in claim 15 wherein each said second leg portion has a cruciform cross-section and each said first portion has a quasi cruciform cross-section.

17. An electronic component transporting system as recited in claim 16 wherein each said retaining means includes a linear shank portion integrally formed at one end thereof with and spaced from said corresponding first leg portion and a linear capture portion extending from the other end of and being skewed with respect to said shank portion thereby to form a camming surface for interacting with said first wall, said first wall pivoting each of said retaining means towards said first portions of said respective leg means as said end stop is inserted into said magazine.

18. An electronic component transporting system as recited in claim 17 wherein said second leg portion has a cruciform cross-section and said first leg portion has a quasi cruciform cross-section with a planar surface spaced and facing said retaining means.

* * * * *